United States Patent
He et al.

(10) Patent No.: US 7,987,586 B2
(45) Date of Patent: Aug. 2, 2011

(54) METHOD FOR MANUFACTURING PRINTED CIRCUIT BOARD HAVING DIFFERENT THICKNESSES IN DIFFERENT AREAS

(75) Inventors: Dong-Qing He, Shenzhen (CN); Ming Wang, Shenzhen (CN); Yun-Li Zhu, Shenzhen (CN); Wen-Chin Lee, Taoyuan (TW)

(73) Assignees: FuKui Precision Component (ShenZhen) Co., Ltd., Shenzhen, Guangdong Province (CN); Foxconn Advanced Technology Inc., Tayuan, Taoyuan (TW)

( * ) Notice: Subject to any disclaimer, the term of this patent is extended or adjusted under 35 U.S.C. 154(b) by 429 days.

(21) Appl. No.: 12/274,190

(22) Filed: Nov. 19, 2008

(65) Prior Publication Data
US 2009/0241333 A1    Oct. 1, 2009

(30) Foreign Application Priority Data

Mar. 28, 2008  (CN) .......................... 2008 1 0300779

(51) Int. Cl.
*H05K 3/36*  (2006.01)
(52) U.S. Cl. ................ 29/830; 29/831; 29/832; 29/846; 29/852
(58) Field of Classification Search .................... 29/830, 29/831, 832, 835, 838, 846, 852; 438/214, 438/113, 107, 358, 406, 412, 53; 156/250, 156/251, 257, 258, 263; 257/522, 415, 419; 174/254, 268
See application file for complete search history.

(56) References Cited

U.S. PATENT DOCUMENTS

| | | | |
|---|---|---|---|
| 4,777,718 A * | 10/1988 | Henderson et al. | 29/620 |
| 5,382,930 A * | 1/1995 | Stokes et al. | 333/191 |
| 6,352,876 B1 * | 3/2002 | Bordogna et al. | 438/69 |
| 7,060,912 B2 * | 6/2006 | Nagashima et al. | 174/262 |

* cited by examiner

*Primary Examiner* — Derris H Banks
*Assistant Examiner* — Tai Nguyen
(74) *Attorney, Agent, or Firm* — Andrew C. Cheng

(57) ABSTRACT

A method for manufacturing a printed circuit board (PCB) having different thicknesses in different areas includes: providing a first substrate having two lateral unwanted portions bounded two imaginary boundary lines, a binder layer having a through opening and a second substrate having a mounting area for mounting electronic elements; forming two slots bounded the imaginary boundary lines in an intermediated unwanted portion of the first substrate corresponding to the mounting area; laminating the first and second substrates, and the binder layer with the mounting area exposed via the through opening; filling the two slots and the through opening with a filling material, thereby obtaining a semifinished PCB board; cutting the semifinished PCB board along the imaginary boundary lines to remove the two lateral unwanted portions and a portion of the second substrate corresponding to the two lateral unwanted portions; and removing the intermediate unwanted portion and the filling material.

6 Claims, 11 Drawing Sheets

METHOD FOR MANUFACTURING PRINTED CIRCUIT BOARD HAVING DIFFERENT THICKNESSES IN DIFFERENT AREAS

BACKGROUND

1. Technical Field

The present invention generally relates to printed circuit boards, and particularly relates to a process for manufacturing a printed circuit board having different thicknesses in different areas.

2. Discussion of Related Art

Printed circuit boards (PCBs) having different thicknesses in different areas have been widely developed. The PCB usually includes different plurality of layers in different areas, i.e., has a thick portion with a number of layers and a thin portion with fewer layers. The thick portion has a higher circuit density whilst the thin portion exhibits higher flexibility.

FIG. 9 shows a structure of a PCB 100 having different thicknesses in different areas. The PCB 100 includes a first substrate 110, a binder layer 130 and a second substrate 120. The PCB 100 has an opening 101 passing through the second substrate 110 and the binder layer 130. The first substrate 110 has an electrical traces layer 111. A mounting area 112 of the electrical traces layer 111 for mounting electronic elements is exposed via the opening 101.

FIGS. 10~11 show a process for manufacturing the PCB 100. As shown in FIGS. 10~11, a first substrate 110 including an electrical traces layer 111, an binder layer 130 having an opening 131 and a second substrate 120 are provided. The second substrate 120 includes a base 121 and a conductive layer 122 formed on the base 121. As shown in FIG. 11, the second substrate 120, the binder layer 130 and the first substrate 110 are laminated, and a portion 120a of the second substrate 120 corresponding to the opening 131 is removed using a laser cutter or a milling cutter.

When the base 121 is made of glass fibers and polymer resin, i.e., the second substrate 120 is a rigid, the second substrate 120 may have different thickness in different areas. It is known that a cutting depth of a laser cutter is in direct proportion with a cutting energy of the laser cutter. To cut off the portion 120a without damaging the mounting area 112, a cutting energy of the laser cutter must be adjusted according to a practical thickness of the second substrate 120 where the laser is applied on. However, it is difficult to precisely control the cutting energy of the laser cutter. Thus, during cutting off the portion 120a, the mounting area 112 may subject to damages cause by the laser cutter.

What is desired, therefore, is a method for manufacturing a printed circuit board having different thicknesses to overcome the above-described problems.

SUMMARY

In one embodiment, a method for manufacturing a printed circuit board having different thicknesses in different areas is provided. A first substrate having two first lateral unwanted portions bounded two imaginary boundary lines is provided. Two slots running between the imaginary boundary lines is defined in the first substrate, thus, the first substrate has an intermediate unwanted portions bounded by the slots and the imaginary boundary lines. A binder layer having a first surface, an opposing second surface and a through opening is provided. Two inner side surfaces in and at opposite sides of the through opening are defined. The first substrate is attached to the first surface of the binder layer with the slots respectively aligned with the inner side surfaces. A second substrate having two second lateral unwanted portions is provided. The second substrate is attached to the second surface of the binder layer with the second lateral unwanted portions respectively aligned with the first lateral unwanted portions. The through opening and the slots is filled using a filling material thereby obtaining a semifinished PCB board. The semi-finished PCB board is cut along the imaginary boundary lines to remove the first and second lateral unwanted portions. And the intermediate unwanted portion and the filling material are removed.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of embodiments. Moreover, in the drawings, like reference numerals designate corresponding parts throughout the different views.

DETAILED DESCRIPTION OF EMBODIMENTS

An exemplary method for manufacturing a printed circuit board (PCB) having different thicknesses in different areas, comprising the steps in no particular order of:

providing a first substrate, the first substrate having two first lateral unwanted portions bounded two imaginary boundary lines, defining two slots in the first substrate, the slots running between the imaginary boundary lines, the first substrate having an intermediate unwanted portions bounded by the slots and the imaginary boundary lines;

providing a binder layer having a first surface and an opposite second surface, the binder layer having a through opening defined therein, and two inner side surfaces in and at opposite sides of the through opening;

attaching the first substrate to the first surface of the binder layer with the slots respectively aligned with the inner side surfaces;

providing a second substrate, the second substrate having two second lateral unwanted portions;

attaching the second substrate to the second surface of the binder layer with the second lateral unwanted portions respectively aligned with the first lateral unwanted portions;

filling the through opening and the slots using a filling material thereby obtaining a semifinished PCB board;

cutting the semi-finished PCB board along the imaginary boundary lines to remove the first and second lateral unwanted portions; and removing the intermediate unwanted portion and the filling material.

The first and second substrate, and the binder layer can be provided simultaneously. The first and second substrate can be simultaneously attached onto the first and second surfaces of the binder layer as well.

The method for manufacturing a printed circuit board having different thicknesses in different areas will be discussed in detail with the following exemplary embodiments.

Figure 1:
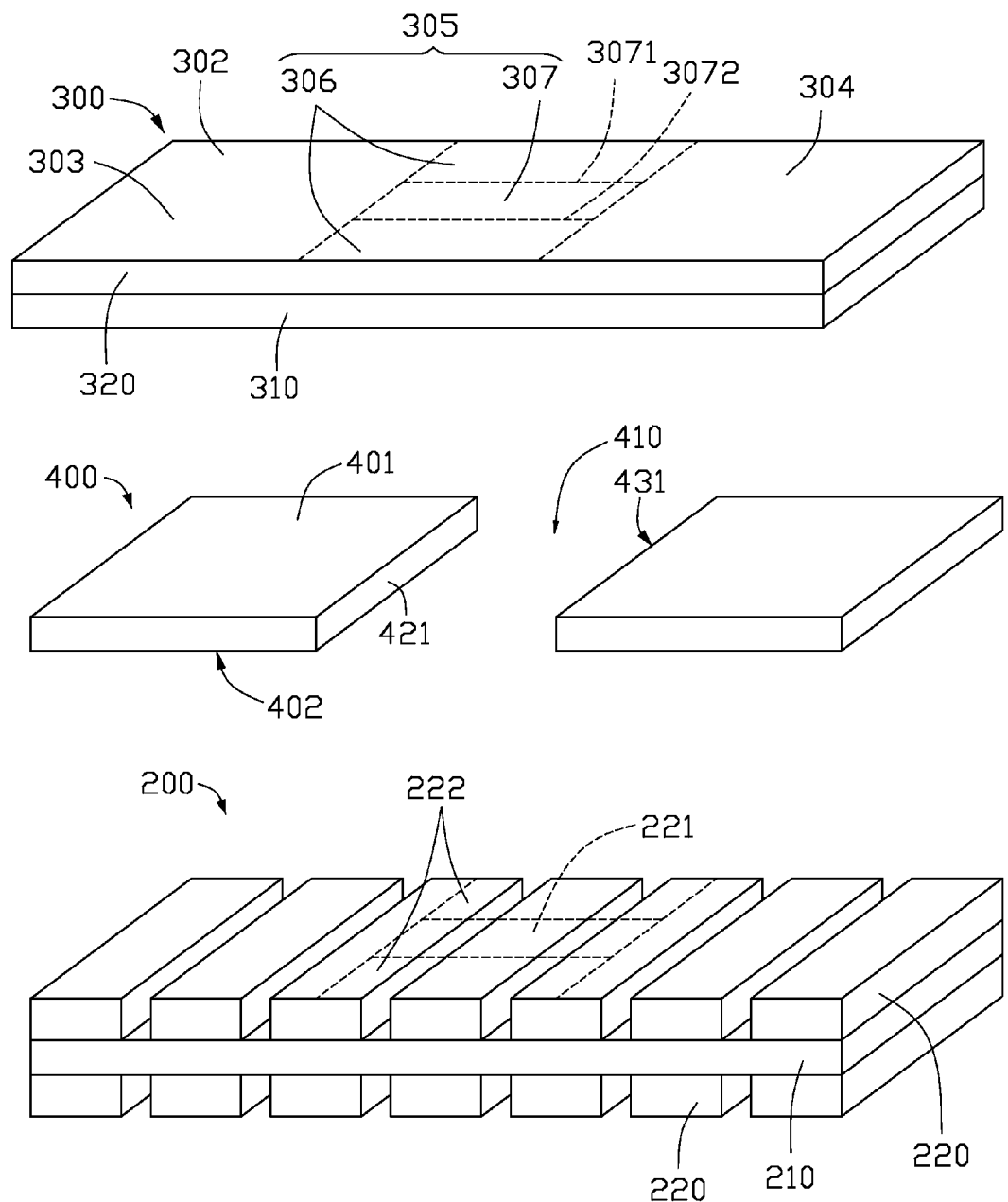
FIG. 1 is an exploded, isometric view of a first substrate, a second substrate and a binder layer having a through opening according to an exemplary embodiment.

As shown in FIG. 1, a first substrate 300, a second substrate 200 and a binder layer 400 are provided.

The first substrate 300 is rigid, and includes a first base 310 and a conductive layer 320 formed thereon. The conductive layer 320 has an outer surface 302. The first base 310 may be a single layer structure comprised of a dielectric resin and glass fibers, or a multilayer structure including a plurality of the mentioned single layer and a plurality of conductive layers. In the present embodiment, the second base 310 is a single layer structure comprised of dielectric resin and glass fibers. The first substrate 300 has a first portion 303, a second portion 304 and an intermediate portion 305 between the first portion 303 and the second portion 304. The intermediate portion 305 has two first lateral unwanted portions 306 bounded a first and second imaginary boundary lines 3071, 3072 defined in the outer surface 302 and an intermediated unwanted portion 307 between the two first lateral unwanted portions 306. The first and second imaginary boundary lines 3071, 3072 are parallel to each other.

The second substrate 200 includes a second base 210 and two electrical trace layers 220 formed on opposite surfaces of the second base 210. The second base 210 may be a single layer structure of dielectric resin or a combination of dielectric resin and glass fibers, or a multilayer structure comprising a plurality of the mention single layer mentioned and a plurality of conductive layers. i.e., the second substrate 200 can be a flexible PCB substrate or a rigid PCB substrate. In the present embodiment, the second substrate 200 is flexible. The electrical traces layer 220 has two second lateral unwanted portions 222 and a mounting area 221 defined between the two second lateral unwanted portions 222. The two second lateral unwanted portions 222 are corresponding to the two first lateral unwanted portions 306. The mounting area 221 is corresponding to the intermediated unwanted portion 307 and is configured for mounting electronic elements. In the illustrated embodiment, the mounting area 221 is located at an intermediated region of the electrical traces layer 220.

The binder layer 400 has a first surface 401 and an opposite second surface 402, and defines a through opening 410 therein. Thereby, the binder layer 400 has a first inner side surface 421 and an opposite second inner side surface 431 in the opening 410. A distance between the first inner side surface 421 and the second inner side surface 431 spatially corresponds to a width of the mounting area 221, so that the mounting area 221 can be entirely exposed via the opening 410. The binder layer 400 is used for conglutinating the first substrate 200 and the second substrate 300.

The dielectric resin and the binder layer 400 can be made of a material selected from the group consisting of polyimide, polytetrafluoroethylene, polythiamine, polymethacrylic acid, polycarbonate, polycarbonate ester, polyester, and copolymer of imide, ethylene and dimethyl terephthate. The conductive layer 320 and the electrical traces 220 can be comprised of copper, silver or aluminum.

Figure 2:
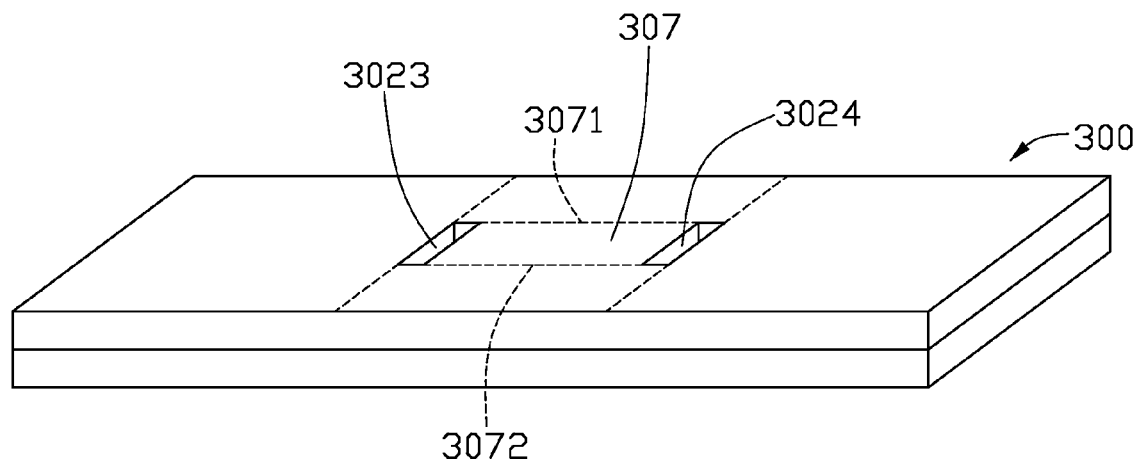
FIG. 2 is similar to FIG. 1, but showing a first slot and a second slot defined in the second substrate.
Figure 2:
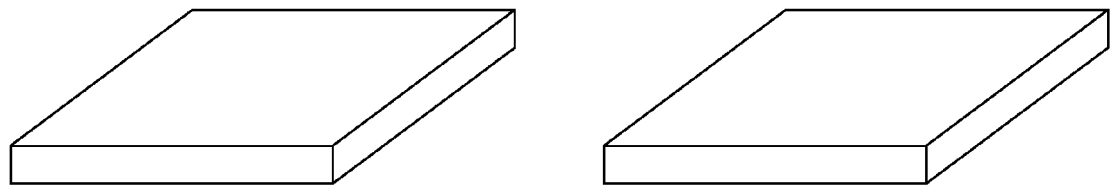
Figure 2:
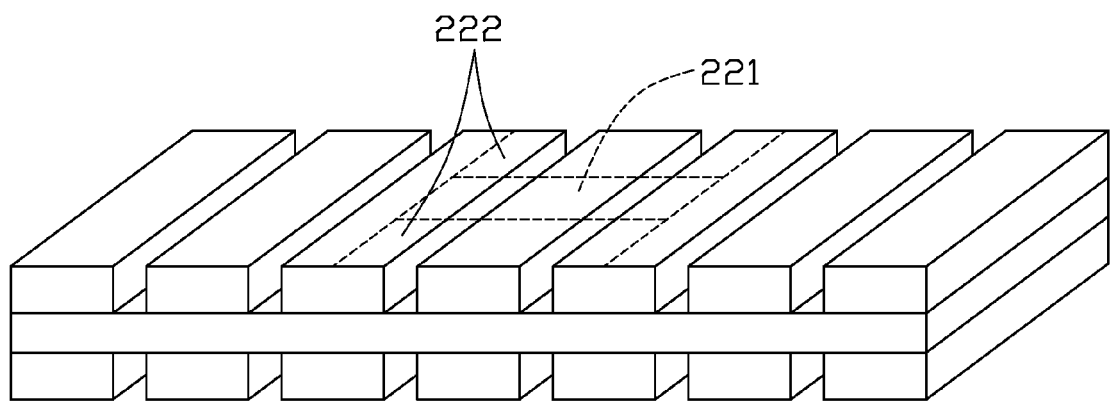

As shown in FIG. 2, a first slot 3023 and a second slot 3024 are formed in opposite ends of the intermediated unwanted portion 307 that both perpendicular adjoining to the first imagery boundary 3071 and the second imagery boundary 3072. The first and second slot 3023, 3024 pass through two opposite surfaces of the first substrate 300, and are parallel to each other. The first slot 3023 and the second slot 3024 may be formed by stamping or laser ablating. In the present embodiment, the first slot 3023 and the second slot 3024 are formed using a stamping process.

Figure 3:
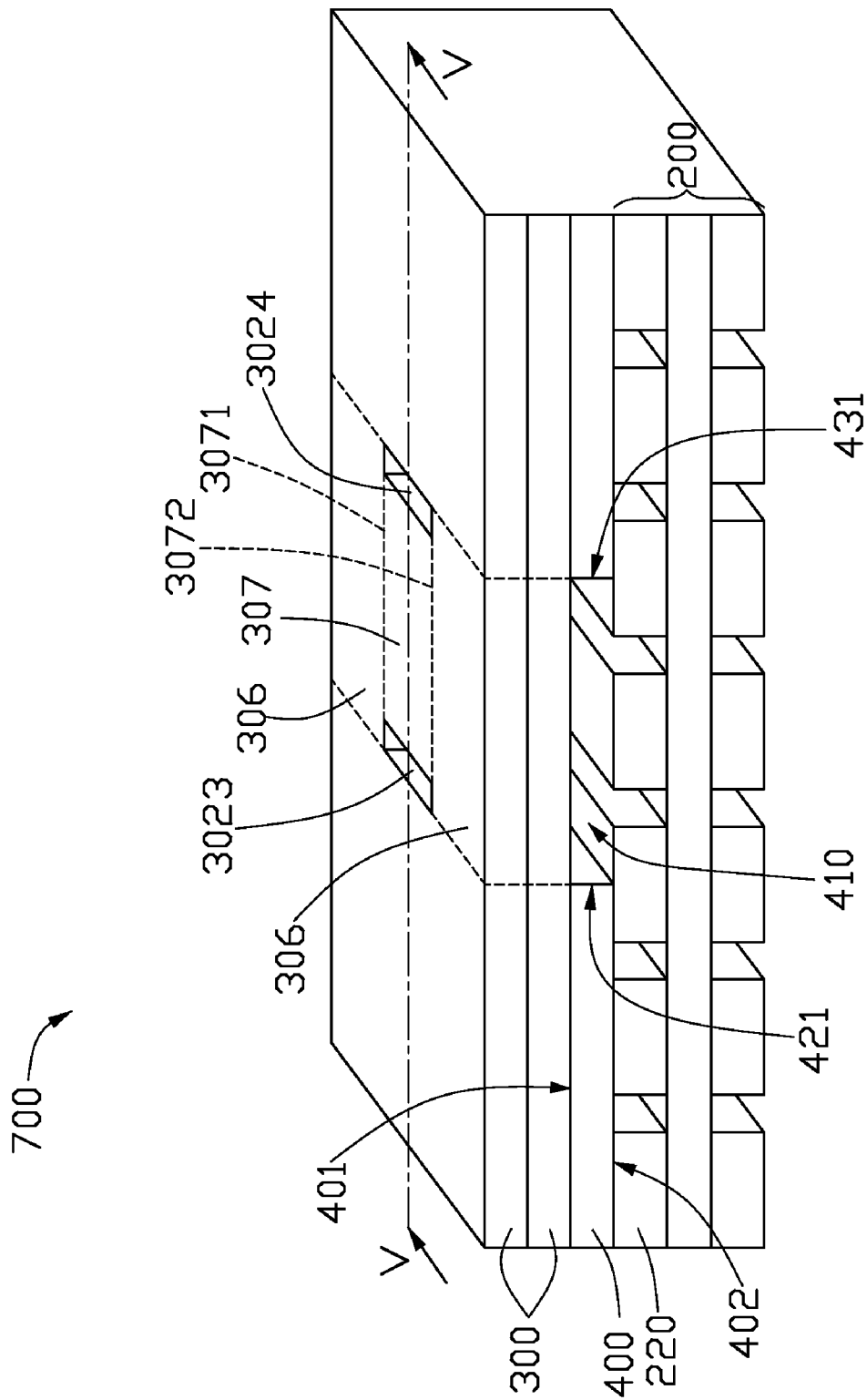
FIG. 3 is an isometric view of a combination of the first substrate, the second substrate and the binder layer.
Figure 4:
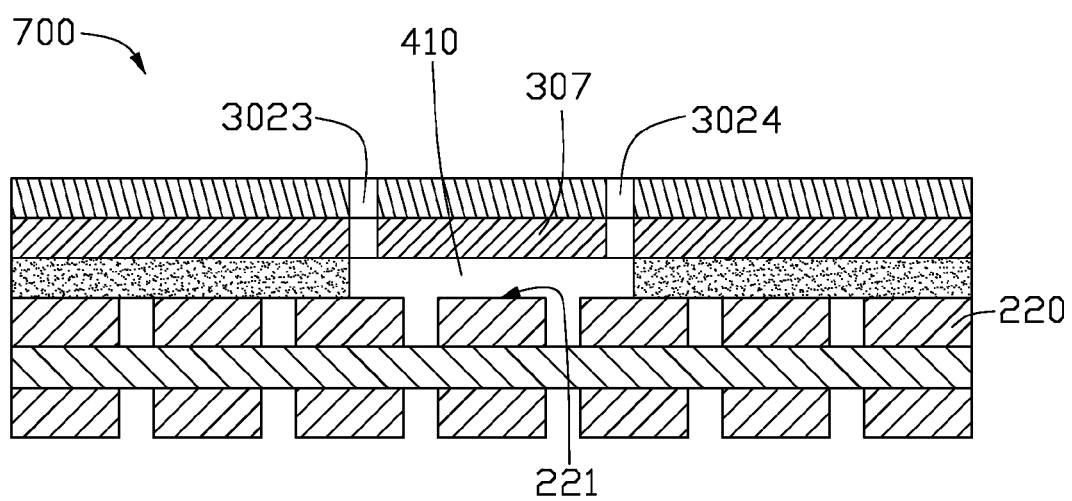
FIG. 4 is a cross sectional view of the semi-finished PCB of FIG. 3, taken along line V-V thereof.

As shown in FIGS. 3~4, the first substrate 300 is attached onto the first surface 401 of the binder layer 400 with the first and second slots 3071, 3072 respectively aligned with the first and second inner side surfaces 421, 431. The electrical trace layers 220 of the second substrate 200 is attached onto the second surface 402 of the binder layer 400 with the second lateral unwanted portions (not shown) aligned with the first lateral unwanted portions 306.

Figure 5:
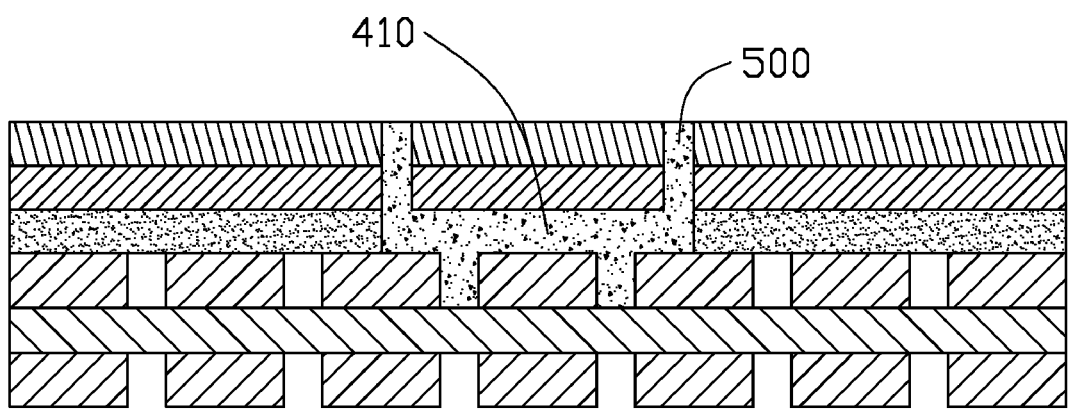
FIG. 5 is similar to FIG. 4, but showing a semifinished PCB board with protective layer filled in the first slot, the second slot and the through opening.

As shown in FIGS. 4~5, a filling material is filled into the first slot 3023, the second slot 3024 and the through opening 410, thereby obtaining a semifinished PCB board 700 having a protective layer 500 formed therein. As such, liquid such as etchant can't seep into the mounting area 221 via the first and second slots 3023, 3024. Therefore, electrical traces 220 in the mounting area 221 are protected from corrosion. The protective layer 500 is made of binder can be easily removed after solidification, such as ultraviolet solidification. The filling material can be filled into the first slot 3023 and the second slot 3024 using a printing method or an injecting process, and then solidified.

Figure 6:
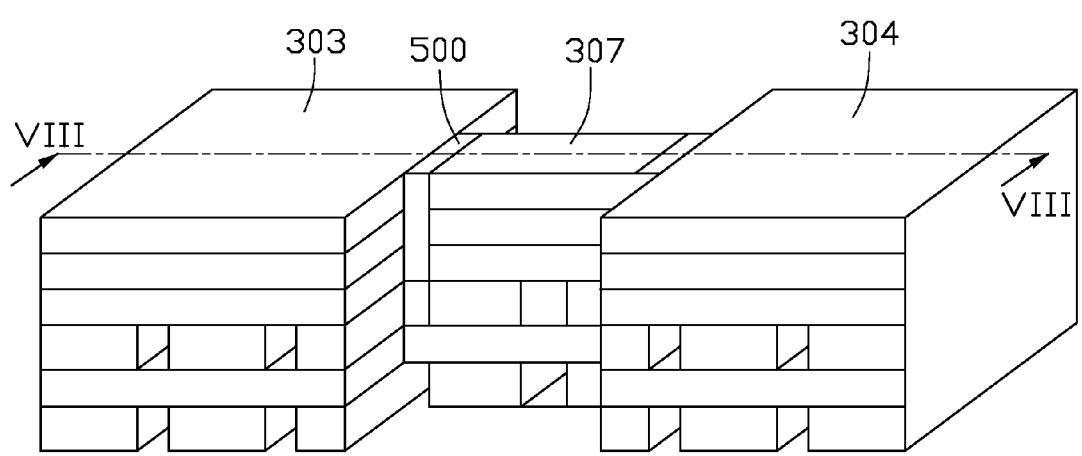
FIG. 6 shows the semi-finished PCB of the FIG. 5 with unwanted portions thereof being removed.

As shown in FIG. 6, the first lateral unwanted portion (not shown) and the second lateral unwanted portion (not shown) are removed using a cutting method or a stamping process. Referring to FIG. 1 and FIG. 5, the first and second lateral unwanted portion 306, 222 are cut along the first and second imaginary boundary lines 3071, 3072, thus, the intermediated unwanted portion 307 is separated from the first portion 303 and the second portion 304 via the protective layer 500.

Figure 7:
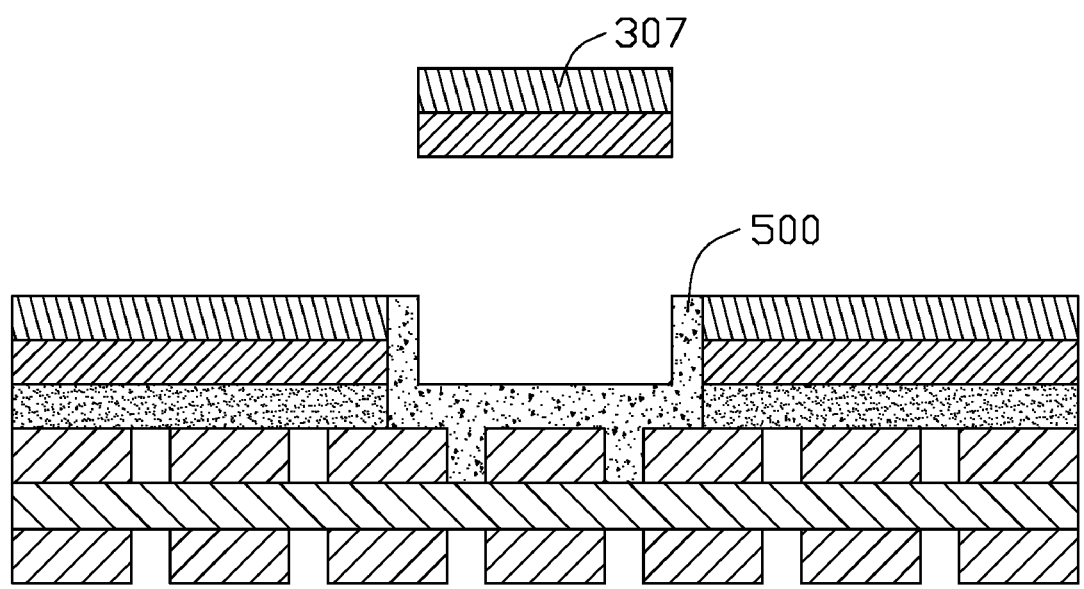
FIG. 7 is a cross-sectional view of the semi-finished PCB of the FIG. 6, taken along line VIII-VIII, showing a step of removing the protective layer.
Figure 8:
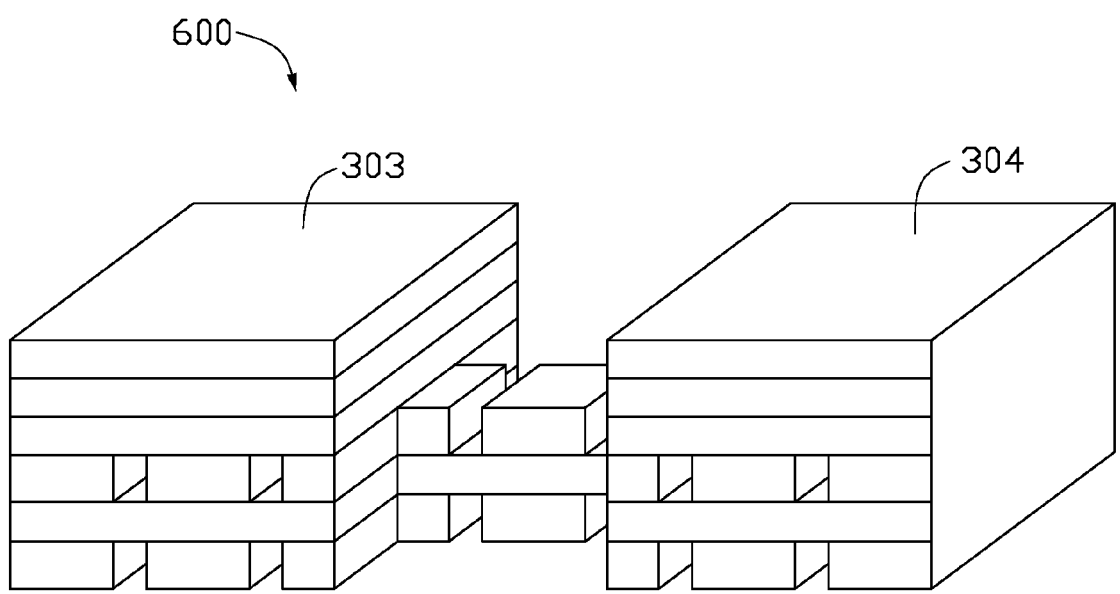
FIG. 8 is an isometric view showing a printed circuit board having different thicknesses in different areas.
Figure 9:
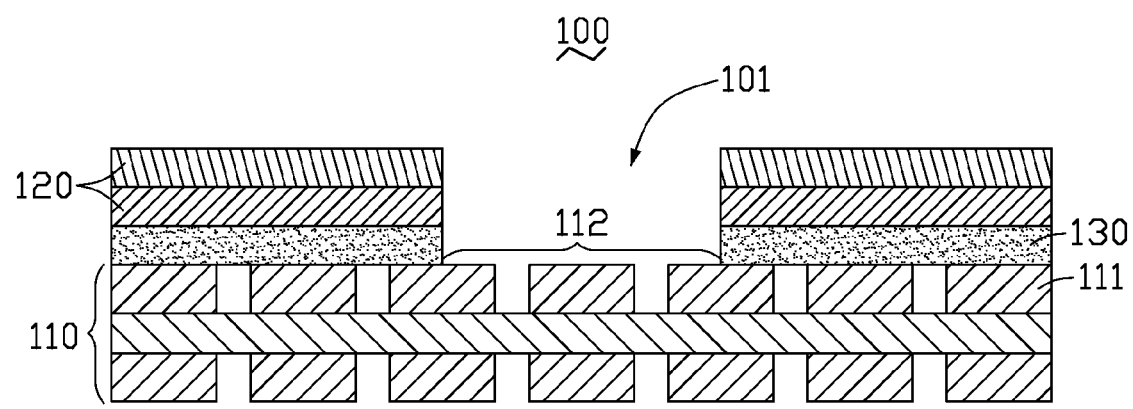
FIG. 9 is a cross-sectional view of a typical printed circuit board having different thicknesses in different areas.
Figure 10:
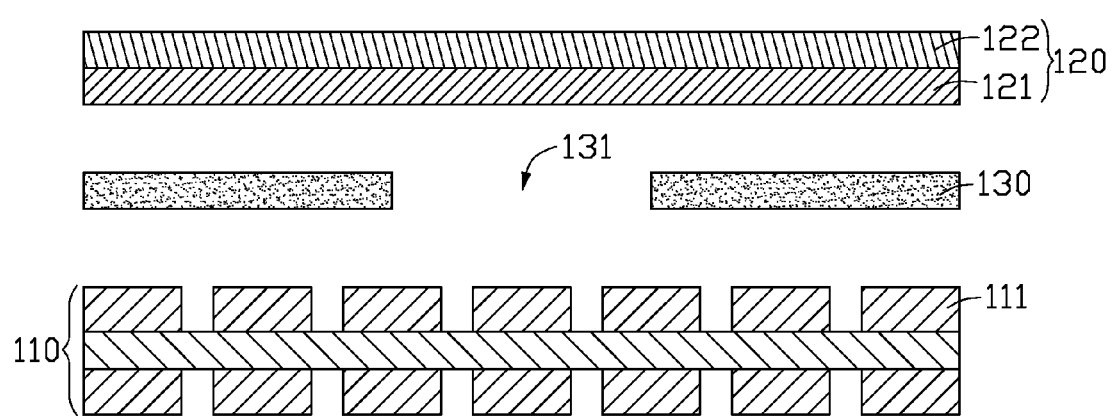
FIGS. 10~11 are cross-section views showing a process for manufacturing a typical printed circuit board as shown in FIG. 9.
Figure 11:
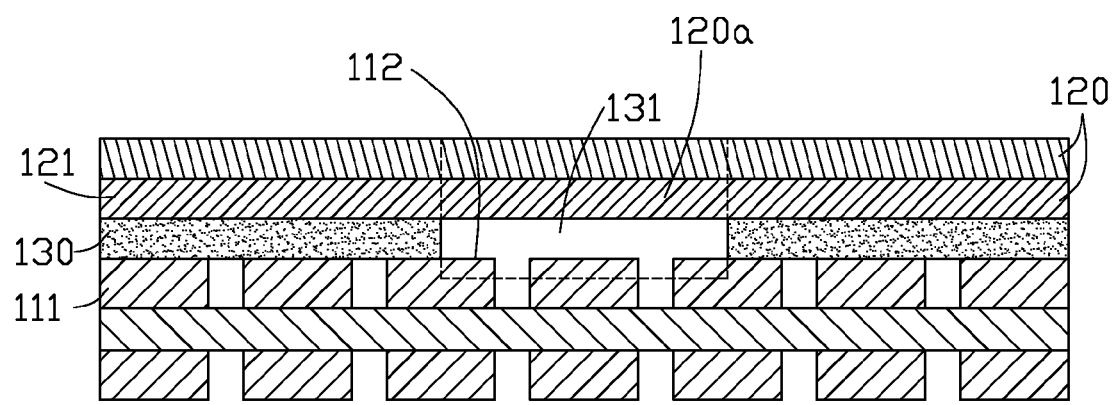

As shown in FIGS. 7~8, the intermediated unwanted portion 307 and the protective layer 500 are removed, thus obtaining a printed circuit board 600 having different thicknesses in different areas. A plurality of electrical traces could be formed in the first portion 303 and the second portion 304.

In the present embodiment, before laminating the first substrate 200, the binder layer 400 and the second substrate 300, a first slot 3023 and a second silt 3024 are preformed in the intermediated unwanted portion 307. And after laminating, the two slots 3023, 3024 are aligned with the first and second inner side surfaces 421, 431, and the mounting area 221 is exposed via the through opening 410. As such, a protective layer 500 could be formed on the mounting area 221 via the two slots 3023, 3024 to protect the mounting area 221 from corrosion, and a cutting could be done along the boundaries of the intermediated unwanted portion 307. As a result, the intermediated unwanted portion 307 could be removed without cutting, therefore, the mounting area 221 is protected from being damaged.

While certain embodiments have been described and exemplified above, various other embodiments will be apparent to those skilled in the art from the foregoing disclosure. The present invention is not limited to the particular embodiments described and exemplified but is capable of considerable variation and modification without departure from the scope of the appended claims.

What is claimed is:

1. A method for manufacturing a printed circuit board (PCB) having different thicknesses in different areas, comprising:
   providing a first substrate, the first substrate having two first lateral unwanted portions bounded two imaginary boundary lines,
   defining two slots in the first substrate, the slots running between the imaginary boundary lines, the first substrate having an intermediate unwanted portions bounded by the slots and the imaginary boundary lines;
   providing a binder layer having a first surface and an opposite second surface, the binder layer having a through opening defined therein, and two inner side surfaces in and at opposite sides of the through opening;
   attaching the first substrate to the first surface of the binder layer with the slots respectively aligned with the inner side surfaces of the binder layer;
   providing a second substrate, the second substrate having two second lateral unwanted portions;
   attaching the second substrate to the second surface of the binder layer with the second lateral unwanted portions respectively aligned with the first lateral unwanted portions;
   filling the through opening and the slots using a filling material thereby obtaining a semifinished PCB board;
   cutting the semi-finished PCB board along the imaginary boundary lines to remove the first and second lateral unwanted portions; and
   removing the intermediate unwanted portion and the filling material.

2. The method as claimed in claim 1, further comprising forming electrical traces in the second substrate after removing intermediate unwanted portion and the filling material.

3. The method as claimed in claim 1, wherein the first substrate is a rigid PCB substrate, and the second substrate is a flexible PCB substrate or a rigid PCB substrates.

4. The method as claimed in claim 1, wherein the slots are parallel to each other.

5. The method as claimed in claim 1, wherein the slots are perpendicular to the imaginary boundary lines.

6. The method as claimed in claim 1, wherein the imaginary boundary lines are parallel to each other.

* * * * *